(12) United States Patent
Ravkin et al.

(10) Patent No.: US 6,616,516 B1
(45) Date of Patent: Sep. 9, 2003

(54) METHOD AND APPARATUS FOR ASYMMETRIC PROCESSING OF FRONT SIDE AND BACK SIDE OF SEMICONDUCTOR SUBSTRATES

(75) Inventors: Michael Ravkin, Sunnyvale, CA (US); John de Larios, Palo Alto, CA (US); Katrina Mikhaylich, San Jose, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 10/017,109

(22) Filed: Dec. 13, 2001

(51) Int. Cl.⁷ .................................................. B24B 7/00
(52) U.S. Cl. ........................ 451/194; 451/63; 451/287; 451/209; 451/489; 451/526
(58) Field of Search ........................... 451/57, 59, 60, 451/63, 177, 178, 194, 209, 210, 242, 254, 287, 332, 397, 398, 424, 489, 526, 527, 528, 530, 532, 536, 538, 539; 134/1, 6, 26; 15/1.51, 1.52, 244.1

(56) References Cited

U.S. PATENT DOCUMENTS

| | | | | |
|---|---|---|---|---|
| 4,208,760 A | * | 6/1980 | Dexter et al. ............... 134/133 |
| 4,630,407 A | * | 12/1986 | Rhodes ....................... 144/361 |
| 4,827,676 A | * | 5/1989 | Kindermann ................ 451/194 |
| 5,088,240 A | * | 2/1992 | Ruble et al. ................. 451/307 |
| 5,099,615 A | * | 3/1992 | Ruble et al. .................. 451/11 |
| 5,486,134 A | * | 1/1996 | Jones et al. ................. 451/209 |
| 5,490,809 A | * | 2/1996 | Jones et al. ................. 451/446 |
| 5,645,471 A | * | 7/1997 | Strecker ...................... 451/299 |
| 5,725,414 A | * | 3/1998 | Moinpour et al. ............. 15/77 |
| 5,795,401 A | * | 8/1998 | Itoh et al. ...................... 134/26 |
| 5,921,848 A | * | 7/1999 | Zang et al. .................. 451/184 |
| 6,033,486 A | * | 3/2000 | Andros ........................... 134/1 |
| 6,328,640 B1 | * | 12/2001 | Jones et al. ................. 451/194 |
| 6,331,213 B1 | * | 12/2001 | Brunelli et al. ................. 134/2 |
| 6,368,192 B1 | * | 4/2002 | Jones et al. ................. 451/209 |
| 6,423,149 B1 | * | 7/2002 | Crevasse et al. ........... 134/25.4 |

* cited by examiner

Primary Examiner—Joseph J. Hail, III
Assistant Examiner—Sharon N. Thornton
(74) Attorney, Agent, or Firm—Martine & Penilla, LLP

(57) ABSTRACT

An asymmetric double-sided substrate scrubber is provided. The asymmetric double-sided substrate scrubber includes a first roller and a second roller. The first roller is constructed from a first material having a first density and the second roller is constructed from a second material having a second density. The second density is designed to be greater than the first density. The first roller is designed to be applied onto a first side of a substrate with a first force and the second roller is designed to be applied onto a second side of the substrate with a second force. The second force is configured to be substantially equivalent to the first force.

22 Claims, 10 Drawing Sheets

Vertical Wafer Scubber

Horizontal Wafer Scubber

METHOD AND APPARATUS FOR ASYMMETRIC PROCESSING OF FRONT SIDE AND BACK SIDE OF SEMICONDUCTOR SUBSTRATES

BACKGROUND OF THE INVENTION

1. Field of the Invention

The present invention relates generally to the fabrication of semiconductor devices and, more particularly, to separately optimizing the front and back side processing of semiconductor wafers.

2. Description of the Related Art

As is well known to those skilled in the art, the fabrication of semiconductor devices involves numerous processing operations. These operations include, for example, impurity implants, gate oxide generation, inter-metal oxide depositions, metallization depositions, photolithography patterning, etching operations, chemical mechanical polishing (CMP), etc. As these operations generate particles and residue, there is a need to clean wafer surfaces, thus removing the contaminants such as adhered particles and adsorbed compounds (e.g., chemicals) from the surfaces of the wafer. It is well known that contaminants should be removed from wafer surfaces, as the existence of such contaminants has a detrimental effect on the performance of the integrated circuit devices.

Initially, a greater emphasis was placed on processing the front side of the wafers as negative consequences associated with presence of contaminants were more pronounced. However, as wafer sizes have increased and feature sizes have decreased, certain shortcomings have been associated with lack of adequate and proper processing of the back side (i.e., non-active side) of wafers. One of such limitations is the deviation of focal plane during the processing of wafers, which is specifically more pronounced during the photolithography-processing step. By way of example, when a wafer is held on a chuck using suction, the presence of contaminants adhered to wafer back side causes the formation of high and low points throughout the wafer surface. As a result, the wafer surface is (locally) tilted, thus creating focal plane deviation. This deviation, although very slight, presents a number of challenges in printing very small features.

In addition to creating focal plane deviation, the contaminant particles have proven to migrate to the wafer front side. The migration may happen during any wet processing steps and/or between the processing tools.

In an attempt to eliminate such drawbacks, double-sided cleaning processing tools have been implemented. One of such double-sided tools is a brush scrubbing tool, which includes a pair of symmetrical brushes. FIGS. 1A and 1B illustrate two types of prior art wafer scrubbers. As shown, FIG. 1A depicts a horizontal wafer scrubber 100 while FIG. 1B shows a vertical wafer scrubber 100'. Both FIGS. 1A and 1B include a pair of brush cores 102a and 102b each having been mounted by a corresponding brush 104a and 104b. As shown, the outer surface of each of the brushes 104a and 104b is covered with a plurality of nodules 105a and 105b, respectively. In both orientations, a wafer 106 is scrubbed as the symmetrical brushes 104a and 104b rotate in a corresponding rotation direction of 108a and 108b.

As shown, the physical makeup of the brush cores 102a and 102b are identical. In a like manner, the outer surfaces of the brushes 104a and 104b are made out of the same material, thus having the same density and compressibility as well as surface contact areas with the wafer. Therefore, in both configurations of prior art wafer scrubbers, an identical amount of pressure is applied to each of the contact areas as the brushes 104a and 104b are respectively applied to the front and the back side of the wafer 106 with identical forces. Consequently, in prior art wafer scrubbers, the front side and the back side of the wafers are treated identically, even though only the front side of the wafer includes active components.

In view of the foregoing, there is a need for an improved semiconductor processing apparatus and methodology capable of simultaneously processing the front and back side of the wafers differently.

SUMMARY OF THE INVENTION

Broadly speaking, the present invention fills these needs by providing an apparatus and methodology capable of asymmetric processing of front and back sides of the wafers. In one embodiment, an asymmetric double-sided brush scrubber is configured to implement asymmetric rollers having different densities, abrasiveness, and/or diameter. In one example, the asymmetric double-sided semiconductor processor is a double-sided brush scrubber configured to clean the front side of the wafer implementing a brush made out of a low density material and the back side of the wafer implementing a brush made out of a high density material. In this manner, each side of the wafer can be treated specific to what is present on that particular side.

It should be appreciated that the present invention can be implemented in numerous ways, including as a process, an apparatus, a system, a device, or a method. Several inventive embodiments of the present invention are described below.

In one embodiment, an asymmetric double-sided substrate scrubber is disclosed. The asymmetric double-sided substrate scrubber includes a first roller and a second roller. The first roller is constructed from a first material having a first density and the second roller is constructed from a second material having a second density. The second density is configured to be greater than the first density. The first roller is configured to be applied onto a first side of a substrate with a first force and the second roller is configured to be applied onto a second side of the substrate with a second force. The second force is configured to be substantially equivalent to the first force.

In one embodiment, as a result of the second density being greater than the first density, the first roller is configured to create a greater contact surface area with the first side of the substrate than the second roller with the second side of the substrate.

In another embodiment, an asymmetric double-sided substrate scrubber is provided. The asymmetric double-sided substrate scrubber includes a first roller having a first diameter and a second roller having a second diameter. The first diameter is configured to be greater than the second diameter. The first roller is configured to be applied onto a first side of a substrate with a first force and the second roller is configured to be applied onto a second side of the substrate with a second force. The second force is configured to be substantially equivalent to the first force. The greater diameter of the first roller is configured to create a greater contact surface area with the first side of the substrate than the second roller with the second side of the substrate.

In yet another embodiment, an asymmetric double-sided substrate scrubber is disclosed. The asymmetric double-sided substrate scrubber includes a pair of first drums and a pair of second drums. The pair of first drums has a first belt-type brush mounted thereon and the pair of second drums has a second belt-type brush mounted thereon. The first belt-type brush is constructed from a first material and is configured to have a first density. The second belt-type brush is constructed from a second material and is configured to have a second density designed to be greater than the first density. The first belt-type brush is configured to be applied onto a first side of a substrate with a first force and the second belt-type brush is configured to be applied onto a second side of the substrate with a second force. The second force is configured to be substantially equivalent to the first force.

In still another embodiment, a method for processing a front side and a back side of a wafer asymmetrically is disclosed. The method includes configuring a first brush for processing the front side of the wafer to have a first compressibility. The method further includes configuring a second brush for processing the back side of the wafer to have a second compressibility. Also included is applying equal force to the front side and the back side of the wafer using the first brush and the second brush. The first brush is configured to achieve a greater compressibility on the front side of the wafer than the second brush on the back side of the wafer.

In yet another embodiment, a method for cleaning a front side and a back side of a wafer asymmetrically is disclosed. The method includes providing a first roller having a material with a first compressibility. Also included is providing a second roller having a material with a second compressibility. The first compressibility is configured to be greater than the second compressibility. The method further includes inserting the wafer such that the first roller having the material with the greater compressibility is closer to the front side of the wafer and the second roller having the material with the lower compressibility is configured to be adjacent to the back side of the wafer. Also included is applying equal force to the front side and the back side of the wafer using the first roller and the second roller. The greater compressibility of the first roller is configured to provide a larger surface area coverage than the second roller with the back side of the wafer. Further included is continuing a scrubbing of the wafer using the first roller and the second roller while applying fluids through one of the brush and a fluid application nozzle. The method also includes discontinuing the scrubbing when the cleaning process removes contaminants on the front side and the back side of the wafer.

The advantages of the present invention are numerous. Most notably, in contrast to the double-sided wafer processors of the prior art, the present invention permits a differential in processing a wafer front side and back side, thus allowing the performance of a greater mechanical action on a selected surface of the wafer. Another advantage is that the embodiments of the present invention can be implemented so as to control the amount of pressure induced on the front side and back side of the wafer despite application of equal forces to the front and back sides of the wafer. Yet another advantage of the present invention is that different magnitude of mechanical action can be performed on the front and back sides of the wafer without substantially bending the wafer or implementing complex systems to control the brush processor.

Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings, and like reference numerals designate like structural elements.

FIG. 3C-2 is a simplified, exploded, cross sectional view of a back brush illustrating the reverse relationship between the density of the brush and the contact surface area, in accordance with still another embodiment of the present invention.

DETAILED DESCRIPTION OF THE PREFERRED EMBODIMENTS

An invention for minimizing the likelihood of damaging active components of a semiconductor wafer through implementing asymmetric process parameters is disclosed. The present invention provides an apparatus and methodology capable of processing a front and a back side of the wafer substantially simultaneously and asymmetrically. In one embodiment, a double-sided semiconductor processor configured to asymmetrically process the front and back sides of the semiconductor wafer by implementing asymmetric process parameters is provided. Preferably, in one implementation, a double-sided brush scrubber is configured to implement asymmetric process rollers having different densities, abrasiveness, and/or diameters. In one example, the double-sided semiconductor processor is a double-sided brush scrubber configured to clean the front side of the wafer implementing a brush made out of a low density material and the back side of the wafer implementing a brush made out of a high density material. In yet another example, the densities can be reversed.

Figure 1B:
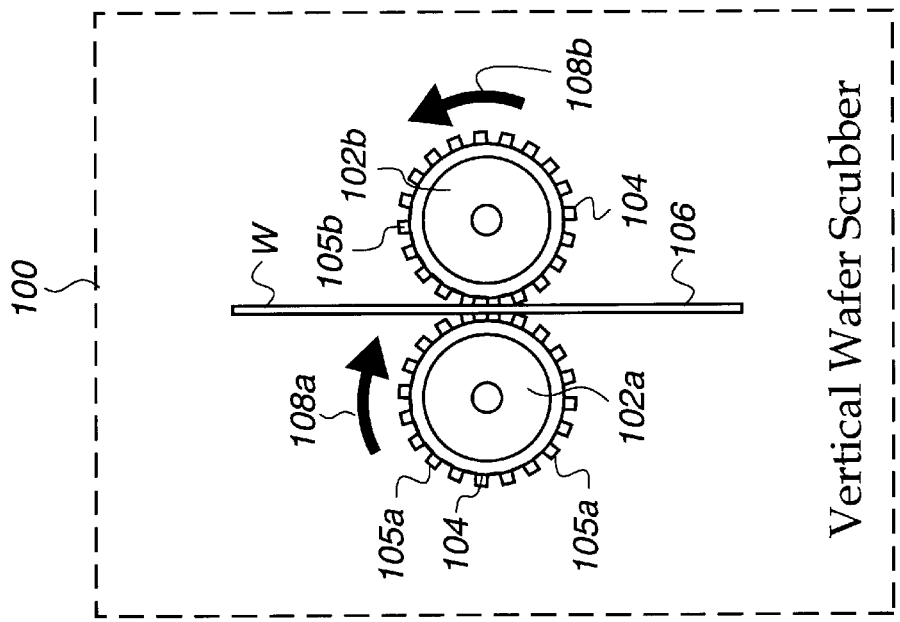
FIG. 1B is a simplified cross-sectional view of a prior art vertical wafer scrubber.
Figure 1A:
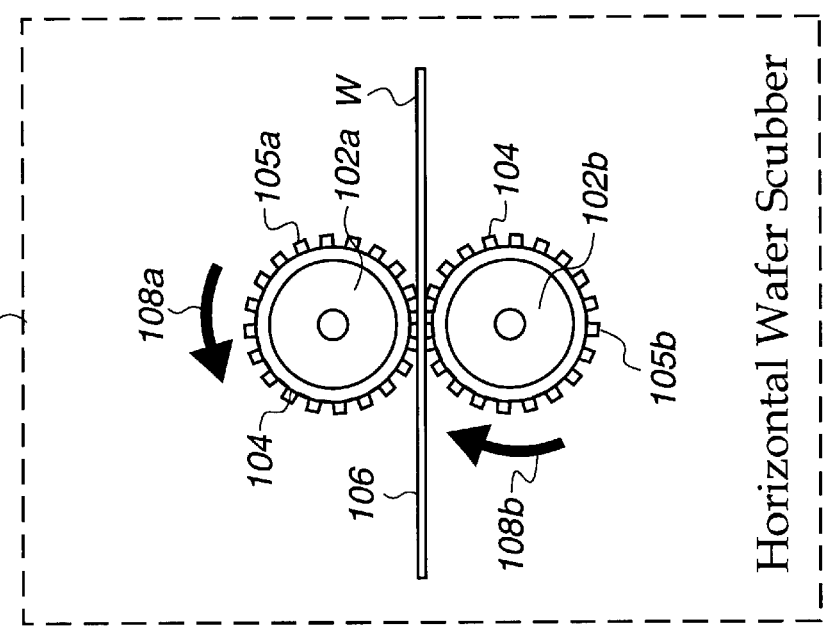
FIG. 1A is a simplified cross-sectional view of a prior art horizontal wafer scrubber.
Figure 2:
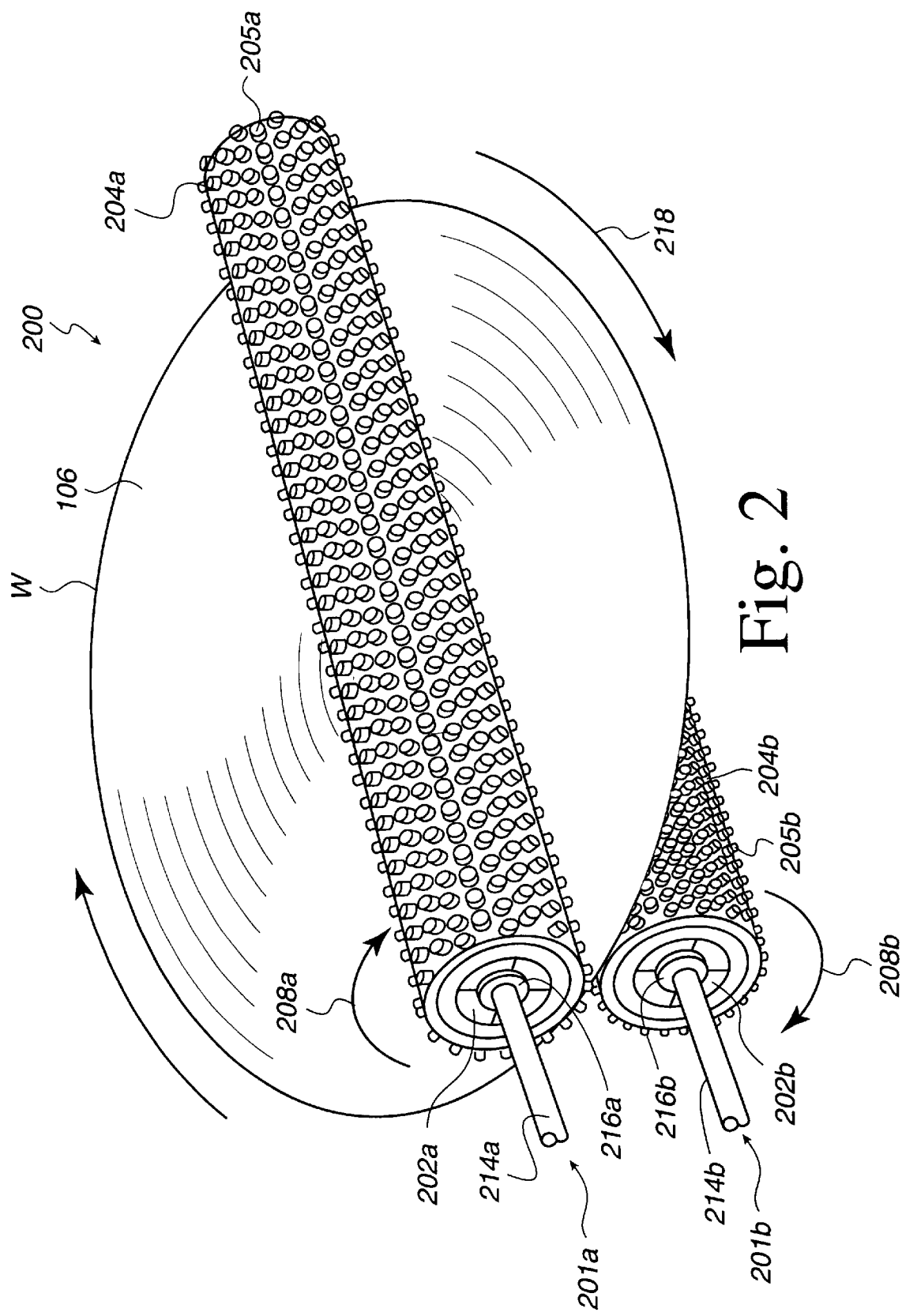
FIG. 2 is a simplified three-dimensional view of an asymmetric double-sided brush scrubber, in accordance with one embodiment of the present invention.

FIG. 2 illustrates an asymmetric double-sided brush scrubber 200, in accordance with one embodiment of the present invention. The asymmetric double-sided scrubber 200 includes a first roller 201a and a second roller 201b each configured to process a corresponding front side 106a and a back side 106b (not shown in this drawings) of a wafer 106. The first roller 201a includes a brush core 202a and a brush 204a mounted thereon. A fluid tube 214a is connected to the brush core 202a at a fluid inlet 216a. The roller 201a is configured to contact the wafer front side 106a as the roller 201a rotates in a rotation direction 208a.

Similarly, the second roller 201b includes a brush core 202b, a brush 204b mounted thereon, and a fluid tube 214b coupled to the brush core 202b at a fluid in let 216b. The roller 201b is configured to process a wafer back side 106b as the brush 204b contacts the wafer back side 106b while the roller 201b rotates in a rotation direction 208b. The wafer 106 is configured to rotate in a rotation direction 218 while the rollers 201a and 201b apply equal but opposite forces to the wafer front side 106a and wafer back side 106b, respectively, as each rotates in the corresponding rotation direction 208a and 208b.

In accordance with the embodiments of the present invention, the brush 204a is constructed from a material having lower density while the brush 204b is constructed from a material having a higher density. As used herein, low and high are comparative terms, used to control the density of a brush contacting one side of a wafer with the density of a brush contacting the other side of the wafer. As shown in the embodiment of FIG. 1, the outer surface of the brush 204a includes a plurality of nodules 205a sparsely disbursed throughout the outer surface of the brush 204a, while the brush 204b also includes a plurality of nodules 205b densely disbursed throughout the surface of the brush 204b. As will be explained in more detail below, implementing brushes constructed from asymmetric materials beneficially allows a scrubber used in accordance with the present invention to apply a higher local pressure to the wafer back side 106b, thus providing a greater level of mechanical processing of the wafer back side 106a, where active devices are not present.

Figure 3A:
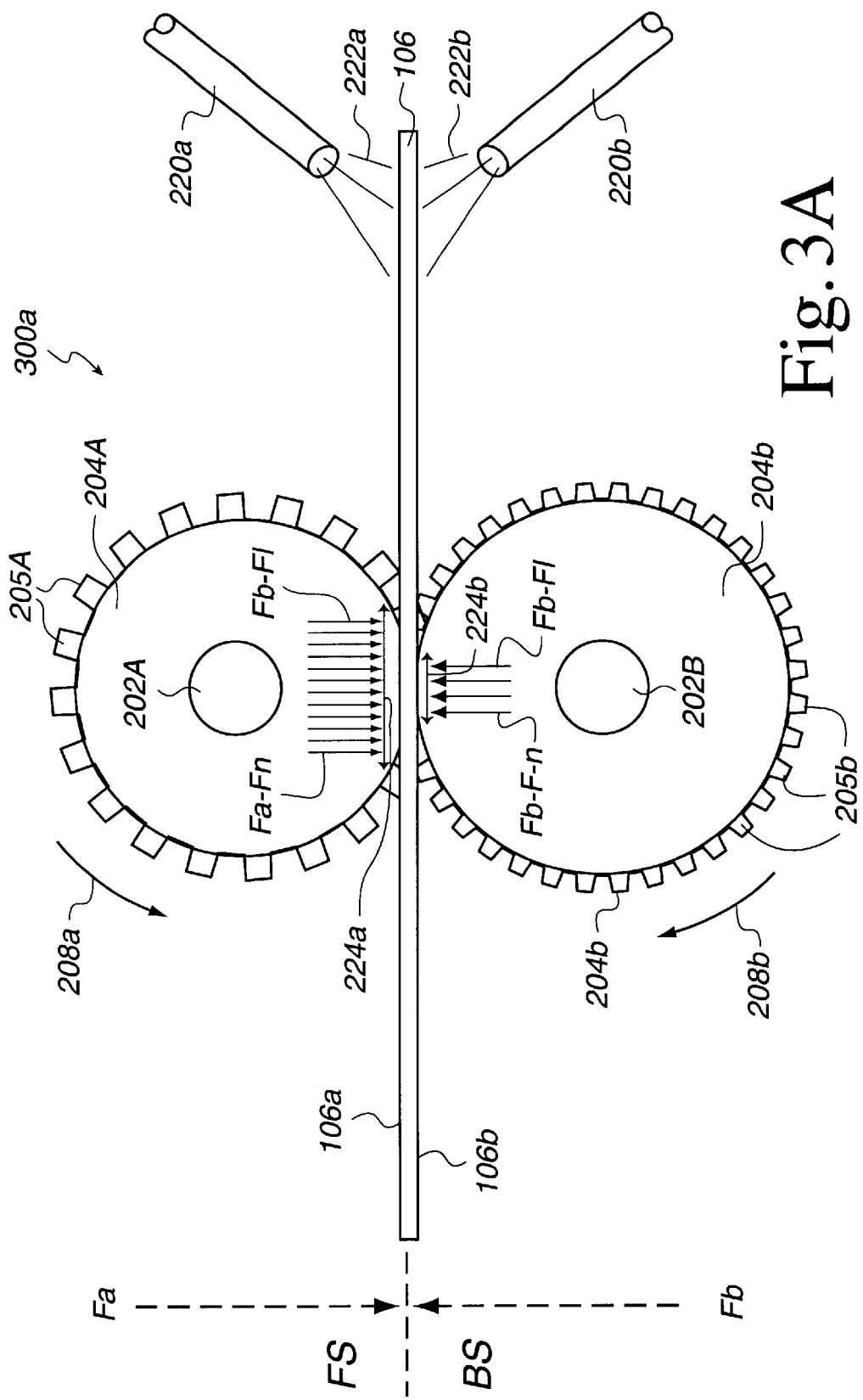
FIG. 3A is a simplified cross sectional view of a horizontal asymmetric double-sided brush scrubber, in accordance with one embodiment of the present invention.

FIG. 3A depicts a cross-sectional view of a horizontal asymmetric double-sided brush scrubber 300a, in accordance with one embodiment of the present invention. As shown, the wafer 106 is held horizontally while the front brush 204a scrubs the wafer front side 106a and the back brush 204b scrubs the wafer back side 106b. As was mentioned above with regard to FIG. 2, the wafer 106 is configured to rotate in the rotation direction 218 while the front and back brushes 204a and 204b rotate. In this manner, substantially the entire surface area of the front and back sides 106a and 106b of the wafer 106 are evenly scrubbed, ensuring the removal of almost all contaminants from the wafer surfaces.

In one exemplary embodiment, the double-sided brush scrubber is symmetric by density, but becomes asymmetric double sided brush scrubber when configured with different rollers on each side of the wafer. As shown in the embodiment of FIG. 3A, a front fluid 222a is directed onto the wafer front side 106a through a front fluid application nozzle 220a while a fluid 222b is directed onto the wafer back side 106b through a back fluid application nozzle 220b. In one embodiment, the front fluid 222a and the back fluid 222b can be an appropriate chemical suitable for use in a brush scrubber. For instance, in one implementation, the wafer front side 106a can be processed implementing individual fluids or combinations of pre-mixed fixed fluids, such as $NH_4OH$, $H_2O_2$, HF, DI water, and a surfactant, while the wafer back side 106b is processed implementing the same or different fluids or simply just DI water.

As shown, in contrast to the prior art, a front contact surface area 224a of the front brush 204a with the wafer front side 106a is greater than a back surface contact area 224b of the back brush 204a with the wafer back side 106b. In this manner, a force Fa applied by the front brush 204a to the wafer front side 106a is distributed through out a larger footprint area, thus applying less localized pressure onto the front contact surface area 224a. As shown, the force Fa in fact consists of a plurality of smaller forces Fa-f1 through Fa-fn, each applied on to the front contact surface area 224a creating a front local pressure of Pa.

In contrast, the force Fb applied by the back brush 204b to the back contact surface area 224b is distributed to a smaller contact surface area 224b, thus applying a higher localized pressure onto the back contact surface area 224b. Similar to front force Fa, the back force Fb consists of a plurality of smaller forces Fb-f1 through Fb-fn, as applied to the back contact surface area 224b creating a back local pressure of Pb.

The reverse relationship between the size of the contact surface areas and the amount of pressure exerted when equal but opposite forces are applied, can be understood with respect to the formula $P=F/A$ (i.e., pressure is equal to the ratio of force being applied to the surface area). That is, the greater is the contact surface area, the lower is the amount of pressure applied. Thus, as shown in the embodiment of FIG. 3A, while the force Fa is equivalent to the force Fb, force Fa is distributed throughout a larger area creating a smaller local pressure, while the force Fb is distributed in a smaller area creating a greater local pressure. In one exemplary embodiment, the brushes are configured to apply a force between approximately about 0.5 lb. and 10 lb., and a more preferred range of approximately about 1 lb. and 7 lb. and most preferably approximately about 3.5 lb. onto the wafer surfaces.

In this embodiment, the formation of contact surface areas of different dimensions is credited to the implementation of brush materials of different densities. As shown, while the outer surface of the front brush 204a has a plurality of sparsely disbursed nodules 205a, the outer surface of the back brush 204b has a plurality of densely disbursed nodules 205b. Additionally, the front brush 204a is constructed from a material having a lower density than the material utilized to construct the back brush 204b. In this manner and as will be described in more detail with respect to FIGS. 3C-1 and 3C-2, the greater density of the material used in the back brush 204b causes the compressibility of the second brush 204b to decrease, creating a smaller contact surface area 224b. In contrast, the lower density of the material used to make the front brush 204a allows the front brush 204a to compress easily, creating a greater contact surface area 224a.

Figure 3B:
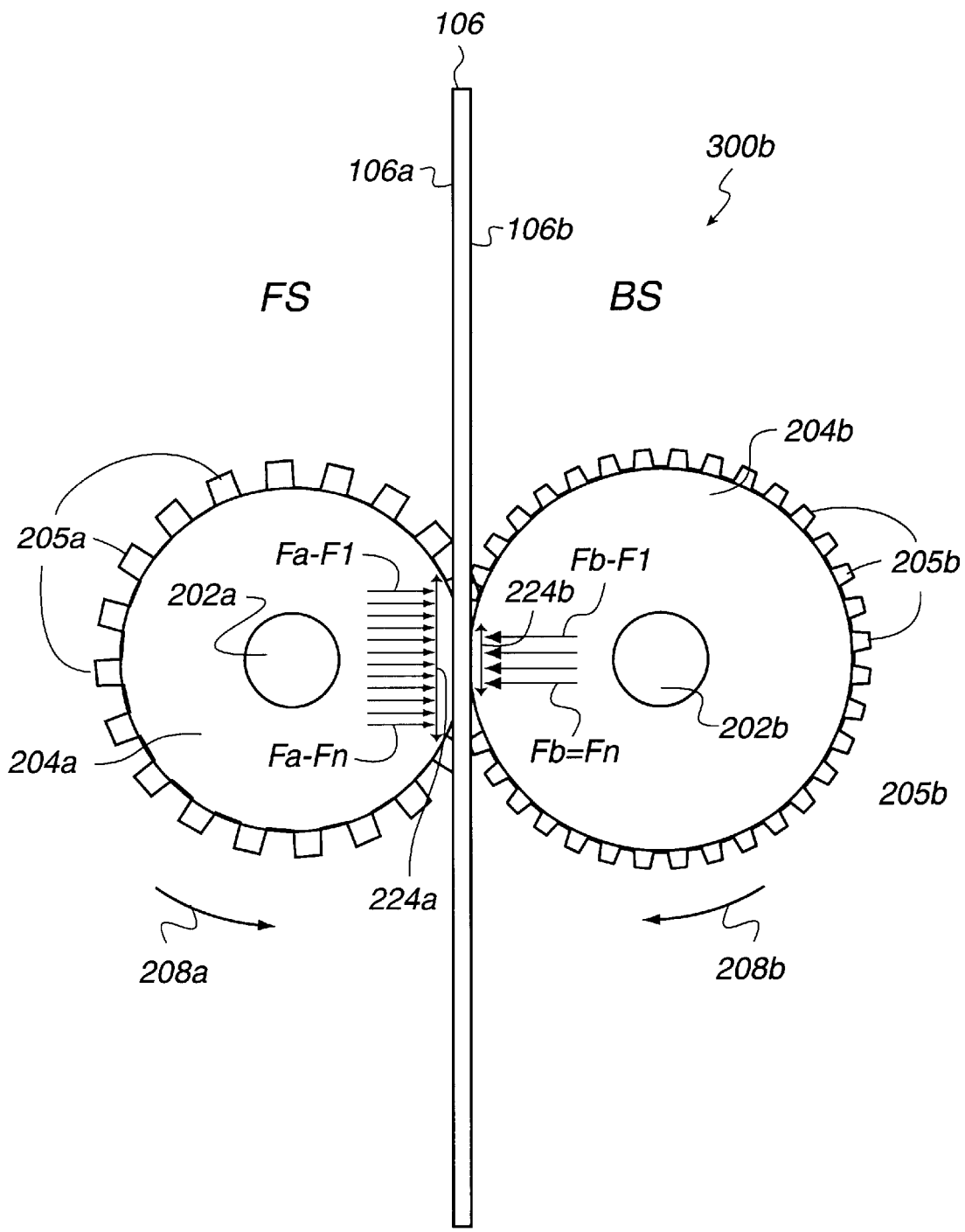
FIG. 3B is a simplified cross sectional view of a vertical asymmetric double-sided brush scrubber, in accordance with still another embodiment of the present invention.

As opposed to the horizontal orientation of the embodiment of FIG. 3A, FIG. 3B shows a cross-sectional view of a vertical asymmetric double-sided brush scrubber 300b, in accordance with one embodiment of the present invention. In one example, the wafer 106 is disposed on a pair of rollers (not shown in this drawing) thus holding the wafer 106, while the wafer 106 is being scrubbed. Similar to the embodiment of FIG. 3A, the respective front and back brushes 204a and 204b are configured to scrub the wafer front and back sides 106a and 106b using opposite but equal forces. Similar to the embodiment of FIG. 3A, a front contact surface area 224a is greater than the back side contact surface area 224b, creating a smaller front local pressure as opposed to the back local pressure.

Figures 2, 3C:
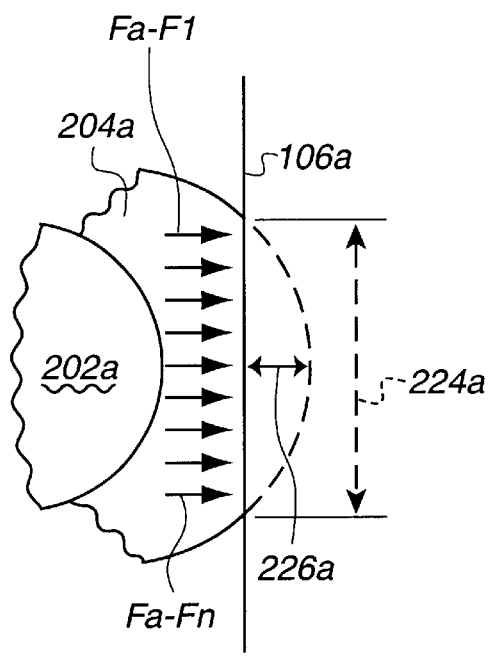
FIG. 3C-1 is a simplified, exploded, cross sectional view of a front brush illustrating the reverse relationship between the density of the brush and the contact surface area, in accordance with still another embodiment of the present invention.
Figures 1, 3C:
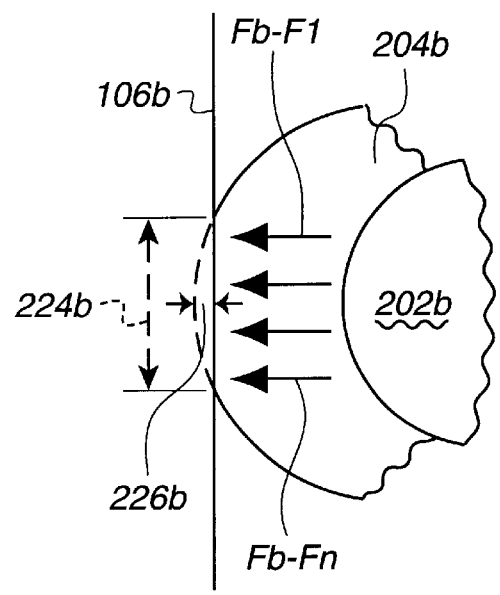

The forming of a smaller back contact surface area 224b and a greater front contact surface area 224b can be understood with respect to the exploded, cross-sectional views illustrated in FIGS. 3C-1 and 3C-2. As shown in FIG. 3C-1, the outer surface of the back brush 204b has compressed a distance 226b when the back brush 204b is pressed against the wafer back side 106b. However, as depicted in the FIG. 3C-2, the outer surface of the front brush 204a has compressed a distance 226a when the front brush 204a is pressed against the wafer front side 106a. As depicted, the distance 226a is greater than the distance 226b. In one embodiment, there is a reverse relationship between the compression distance 226a of the front brush 204a and the density of the material used to make the front brush 204a. That is, the greater is the density of the material implemented to make the brush 204a, the smaller is the contact area of the brush 204a with the wafer surface. In this manner, the brush 204b can apply a greater mechanical action to the back side of the wafer, providing more effective cleaning thus eliminating the possibility of cross-contamination and focal plane deviation associated with the lack of proper processing of the prior art wafer back sides.

In accordance with one embodiment of the present invention, the front brush 204a is a brush made out of polyvinyl alcohol (PVA) foam. The PVA material can have any surface topography and in one embodiment, the surface can be smooth. However, in a different embodiment, the outer surface of the roller 204a can be made out of a material suitable for processing the wafer back side (e.g., nylon, mohair, a mandrel wrapped with a polishing pad material, a polyurethane roller, high density PVA, etc.) Moreover, in one embodiment, the brush 204a can be configured to be a removable and disposable brush.

In one preferred implementation, the density of the PVA foam implemented in the front brush 204a is configured to range between approximately about 0.07 g/cm$^3$ and 0.085 g/cm$^3$, and a more preferred range of approximately about 0.07 g/cm$^3$ and 0.08 g/cm$^3$, and most preferably is approximately about 0.075 g/cm$^3$ for the wafer front side.

Preferably, in one exemplary implementation, the back brush 204b used to process the wafer back side 106b can be made out of a PVA foam having a higher density than the material used to construct the front brush 204a. However, in a different embodiment, the back brush 204b can be made out of a material suitable for processing the wafer back side so long as the density of the material of the back brush 204b is greater than the density of the material used to construct the front brush 204a (e.g., nylon, mohair, a mandrel wrapped with a polishing pad material, Suba 4, Politex (by Rodel Corporation), etc.) For instance, the front brush 204a can be constructed from a PVA foam while the back brush 204b can be constructed from a different material (i.e., non-PVA foam material), so long as the density of the material used to construct the back brush 204b is greater than the density of the material used to construct the front brush 204a.

Preferably, the density of the PVA foam implemented in the bottom brush 204b is configured to range between approximately about 0.08 g/cm$^3$ and 0.095 g/cm$^3$, and more preferably range between approximately about 0.085 g/cm$^3$ and 0.095 g/cm$^3$, and most preferably is approximately about 0.095 g/cm$^3$.

Thus, beneficially, the embodiments of the present invention enable the asymmetric processing of the front and back sides of the wafers. In this manner, the front side and back side of the wafers can be processed differently such that a greater mechanical action can be performed on the back side of the wafer eliminating the possibility of contaminant migration.

Figure 4:
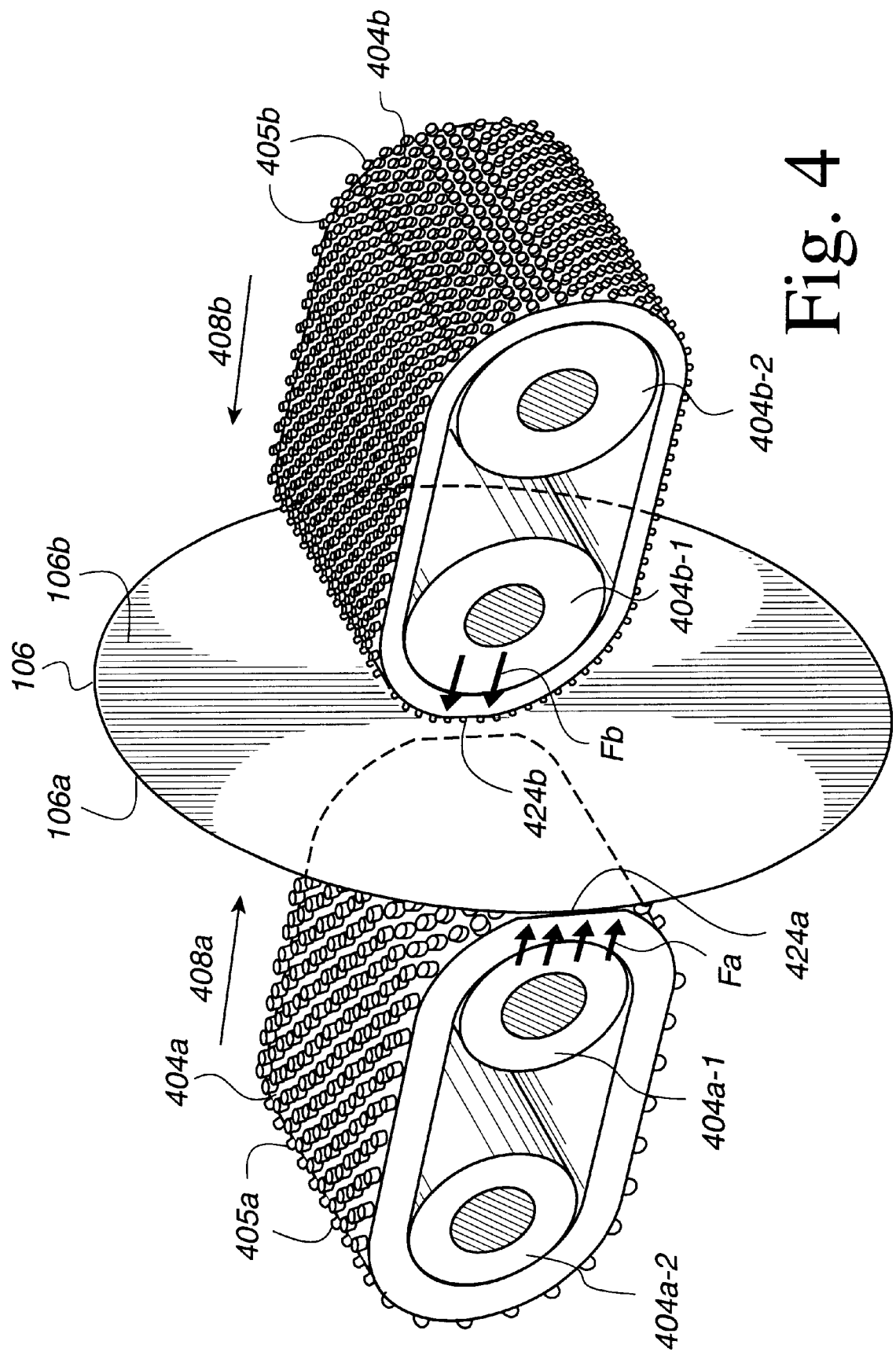
FIG. 4 is a simplified three-dimensional view of an asymmetric double-sided belt-type wafer scrubber, in accordance with one embodiment of the present invention a, in accordance with still another embodiment of the present invention.

Reference is made to a double-sided belt-type scrubber 400 of FIG. 4, in accordance with one embodiment of the present invention. As shown, a front belt 404a defined on a pair of drums 404a-1 and 404a-2 is configured to rotate in a rotation direction 408a, processing the wafer front side 106a. As shown, a plurality of nodules 405a are disbursed sparsely on an outer surface of the front belt 404a. In a like manner, a back belt 404b defined on a pair of drums 404b-1 and 404b-2 is configured to rotate in a rotation direction 408b, processing the wafer back side 106b. In one preferred embodiment, the back belt 404b is constructed from a material having a higher density than the material implemented to construct the front belt 404a.

Preferably, in one exemplary implementation, a plurality of nodules 405b are densely disbursed on an outer surface of the back belt 404b, while the plurality of nodules 405a are sparsely disbursed on the outer surface of the front belt 404a. In this manner, a greater contact surface area 424a is created due to the front belt 404a coming into contact with the wafer front side 106a. In contrast, a smaller contact surface area 424b is created where the back belt 404b comes into contact with the wafer back side 106b. As was explained in greater detail above, due to the front belt 408a being constructed from a material having a less density than the material implemented in the back belt 408b, the front belt 408a has a greater contact surface area 424a with the wafer front side 106a than the back belt 408b with the wafer back side 106b. Particularly, this occurs despite the front belt 404a and back belt 404b being respectively applied to the wafer front side 106a and the wafer back side 106b with equal but opposite forces.

Figure 5:
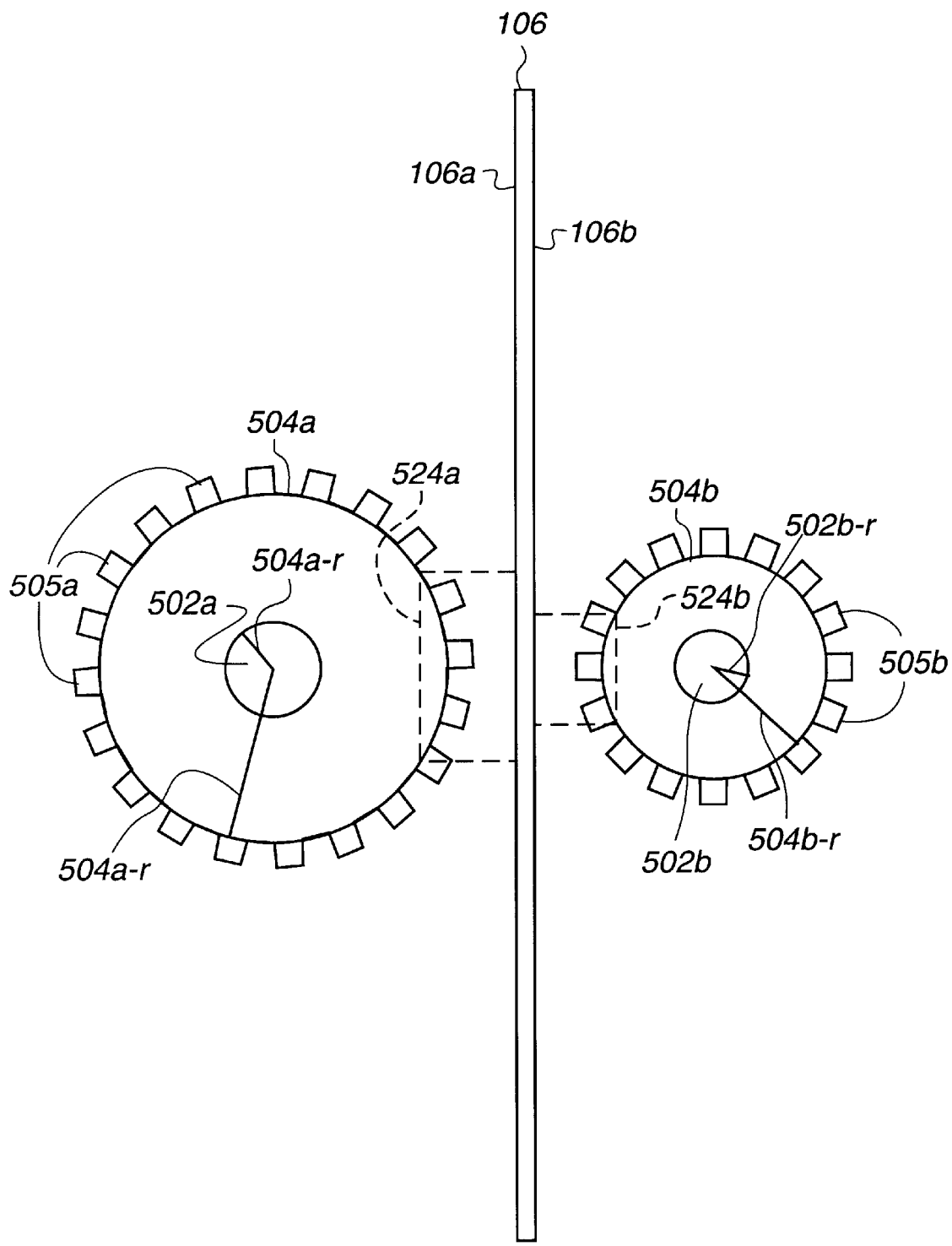
FIG. 5 is a simplified cross-sectional view of an asymmetric double-sided brush scrubber implementing brushes of different dimensions, in accordance with still another embodiment of the present invention.

Referring to FIG. 5, an asymmetric double-sided brush scrubber implementing brushes of different dimensions can be understood, in accordance with one embodiment of the present invention. As shown, a front brush 504a is mounted on a front brush core 502a while a back brush 504b is mounted on a back brush core 502b. As shown, a radius 504a–r of the front brush 504a is greater than a radius 504b–r of the back brush 504b. As shown, in the embodiment of FIG. 5, a radius 502-r of the front brush core 502a is greater than a radius 502b–r of the back brush core 502. However, in another embodiment, the back brush may be configured to have a greater radius than the front brush.

As shown, a plurality of nodules 505a and 505b are respectively provided on the outer surfaces of the front brush 504a and the back brush 504b. Preferably, the nodules 505a and 505b are disbursed on the outer surfaces of front brush 504a and the back brush 504b in equal distance. In this manner, the greater radius 504a–r of the front brush 504a creates a greater contact surface area with the wafer front side 106a than the smaller radius 504b–r of the back brush 504b with the wafer back side 106b. As a result, the equal but opposite forces applied by the front brush 504a and back brush 504*b* onto the wafer front side 106*a* and back side 106*b*, respectively, are applied to a greater front contact surface area 524*a* as opposed to the back contact surface area 524*b*, providing a greater mechanical processing of the wafer back side 106*b*.

In a different embodiment, the asymmetric brush scrubber of the present invention is configured to implement a pair of flat brushes each mounted on a pair of opposing discs. In one example, a diameter of the disc being applied onto the wafer front side is configured to be greater than a diameter of the disc being applied onto the wafer back side. In the same manner, a thickness of the brush mounted on the disc being applied onto the wafer front side is configured to be less than a thickness of the brush mounted on the disc being applied to the wafer back side.

It must be noted that in another embodiment, the front brush can be configured to move relative to the wafer front side as the front brush rotates, while the back brush is designed to rotate in place. In this manner, the back brush provides support as the wafer front side is being processed. In a different embodiment, the back brush can be configured to move relative to the wafer back side as the back brush rotates, while the front brush rotates in position, thus supporting the wafer.

Figure 6:
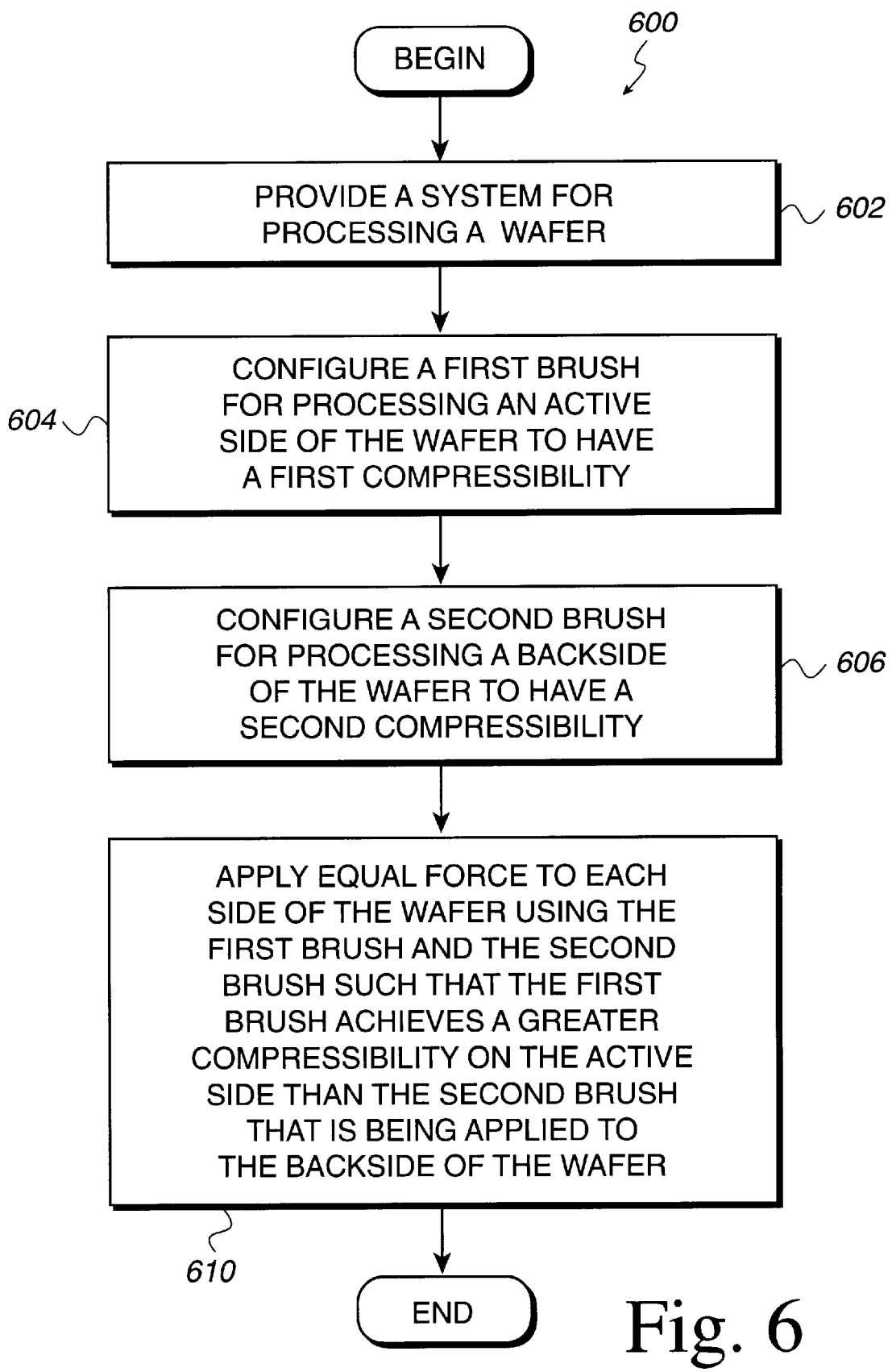
FIG. 6 is a flow chart diagram illustrating the method operations implemented in an asymmetric double-sided brush scrubber, in accordance with another embodiment of the present invention.

FIG. 6 shows a flow chart diagram 600 illustrating the method operations implemented in an asymmetric brush scrubber, in accordance with one embodiment of the present invention. The method begins in operation 602 in which a system for processing a wafer is provided. In one embodiment, the system is a polishing system. However, in a different embodiment, the system may be configured to be a cleaning system. Next, in operation 604, a first brush for processing an active side of the wafer is configured. The first brush is configured to have a first compressibility.

Moving to operation 606, a second brush for processing a back side of the wafer is configured. The second brush is configured to have a second compressibility. As discussed above, the compressibility of the brushes has an inverse relationship with the density. In one preferred embodiment, the compressibility of the first brush is greater than the compressibility of the second brush.

Proceeding to operation 610, equal but opposite forces are applied to each side of the wafer using the first brush and the second brush. The first brush is configured to achieve a greater compressibility on the active side of the wafer than the second brush being applied to the back side of the wafer. As discussed in more detail above, the compressibility of the first and second brush has an inverse relationship with the density of the material implemented to make the brush. That is, the higher is the density of the material of the brush; the lower is the compressibility of the brush. Thus, where the density of the first brush is lower than the second brush, the higher density of the second brush results in a second brush having a lower compressibility. In a like manner, the lower density of the first brush results in a first brush having a greater compressibility. As a consequence, despite using equal but opposite forces, the greater compressibility of the first brush allows the force applied to the active side of the wafer being spread within a larger contact surface area than the lower compressibility of the second brush.

Figure 7:
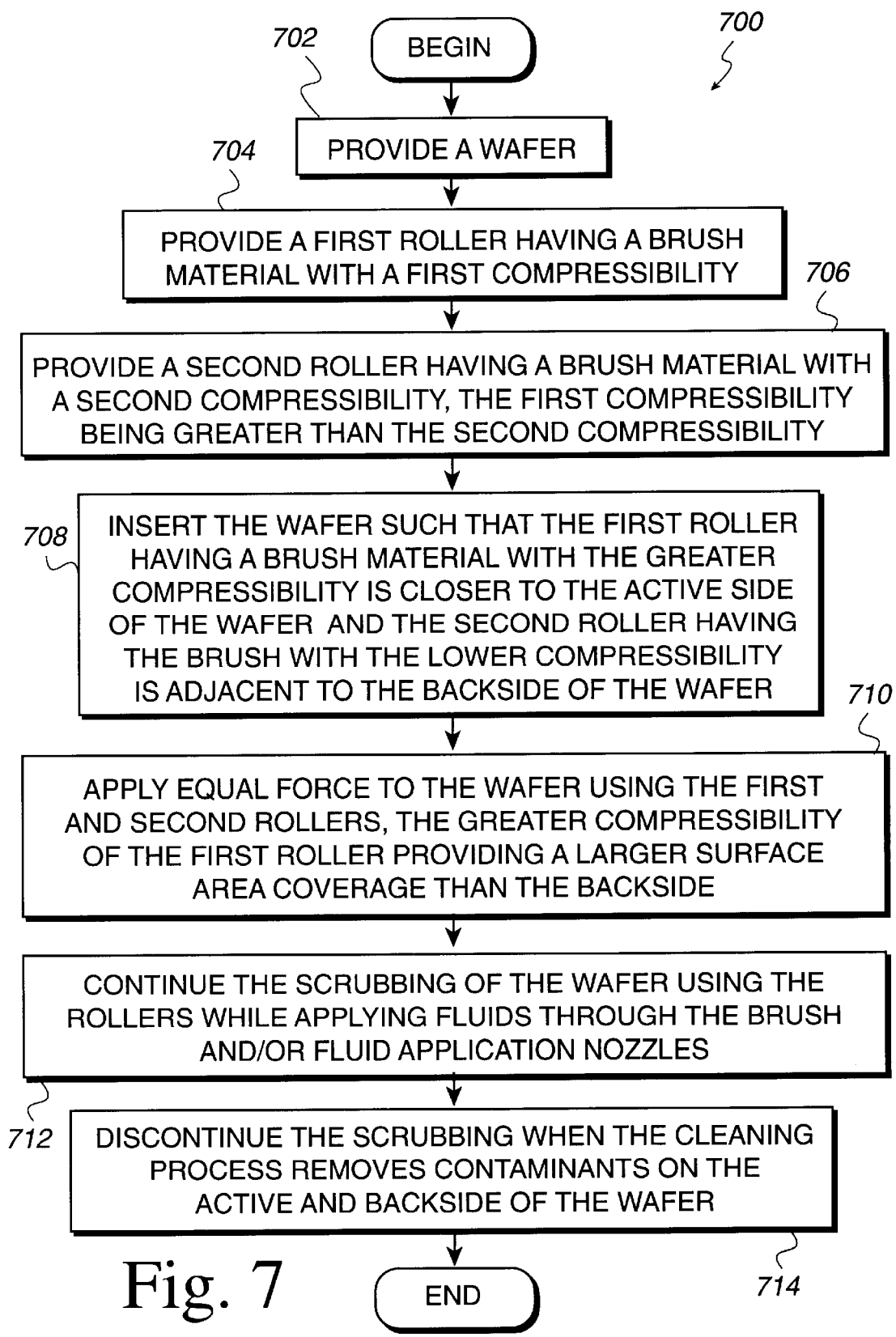
FIG. 7 is a flowchart diagram illustrating method operations performed in cleaning front and back sides of a wafer in an asymmetric double-side brush scrubber, in accordance with yet another embodiment of the present invention.

A method operations in cleaning front and back sides of a wafer in an asymmetric double-side brush scrubber can be understood with respect to a flowchart 700 depicted in FIG. 7, in accordance with one embodiment of the present invention. The method begins in operation 702 in which a wafer is provided. Then in operation 704, a first roller having a brush material with a first compressibility is provided followed by providing a second roller having a brush material with a second compressibility in operation 706.

Proceeding to operation 708, the wafer is inserted between the first roller and the second roller such that the roller having the brush material with the greater compressibility is closed to the active side of the wafer and the roller having the brush material with less compressibility is adjacent to the back side of the wafer. Next, in operation 710, the first and second rollers apply equal forces to the wafer. The greater compressibility of the first roller provides a larger surface area coverage in the front side of the wafer than the second roller with the back side of the wafer.

Continuing to operation 712, the scrubbing of the wafer is continued using the rollers, while fluids are applied to the front and back sides of the wafer through the brush and/or fluid application nozzles. In one embodiment wherein the fluids are applied to the front and back sides of the wafer through the brushes, each of the brush cores includes a plurality of holes along the length of the core, allowing substantially even distribution of fluid onto the front and back sides of the wafer. For more information on the wafer scrubbing brush core, reference may be made to U.S. Pat. No. 6,240,588 issued on Jun. 5, 2001, having inventors Dickey et al., and entitled "Wafer Scrubbing Brush Core," which is hereby incorporated by reference.

In a different embodiment, fluids are applied onto the front and back sides of the wafer implementing fluid application nozzles. As discussed above, in one embodiment, the wafer front side can be processed implementing individual fluids or combinations of pre-fixed fluids, such as $NH_4OH$, $H_2O_2$, HF, DI water, surfactant, and a surfactant, while the wafer back side is processed implementing the same or different fluids or simply just de ionized water.

Subsequently, in operation 714, the scrubbing of the front and back sides of the wafer is discontinued when the cleaning process removes contaminants on the active and back side of the wafer. In this manner, despite using equal forces, the active side of the wafer (wafer front side) is scrubbed using less mechanical action while the back side of the wafer is scrubbed with a greater mechanical action, thus substantially eliminating cross-contamination caused by lack of proper cleaning of the wafer back side.

Figure 8:
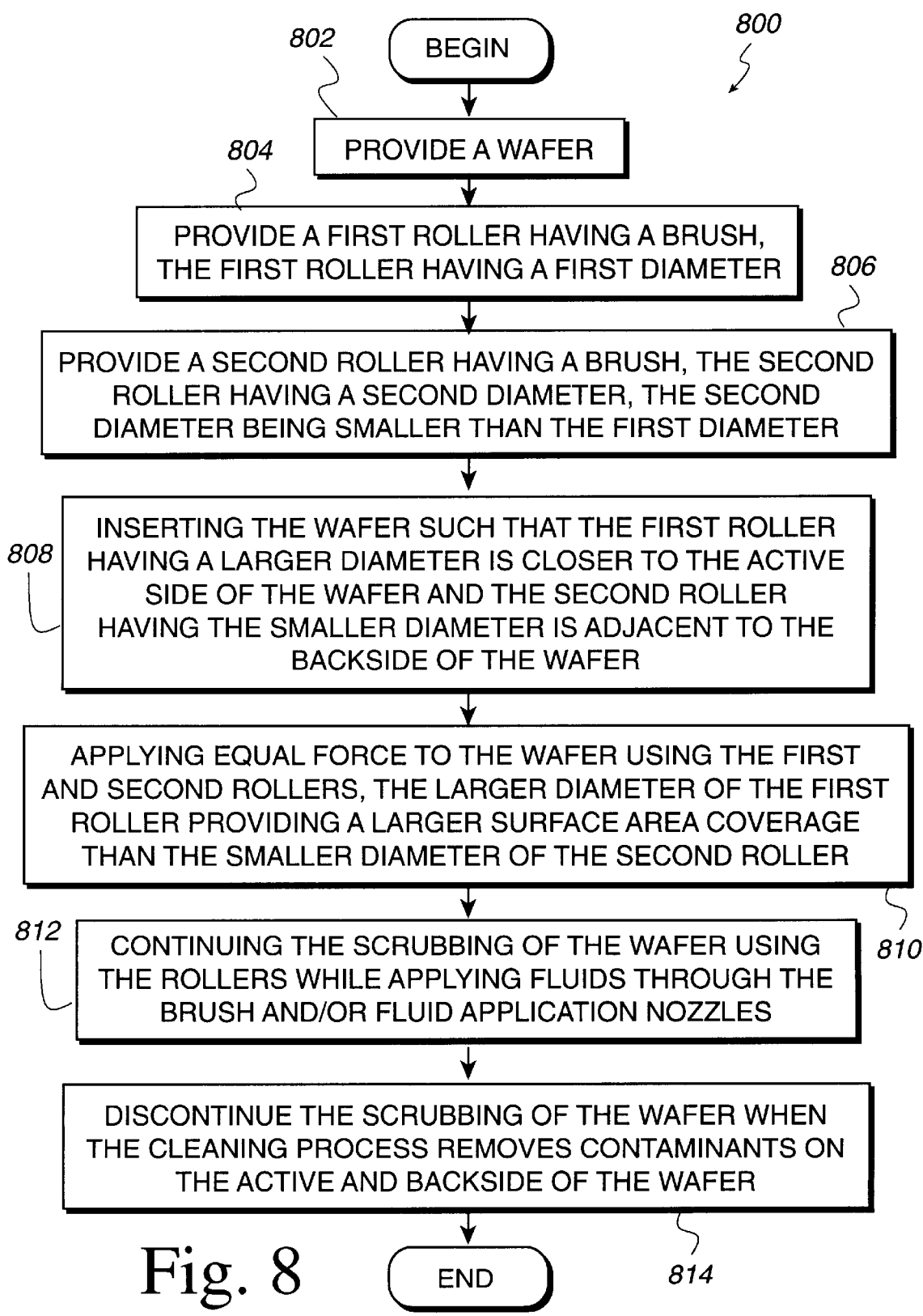
FIG. 8 is a flowchart diagram illustrating method operations performed in an asymmetric double-sided brush scrubber implementing rollers of different dimensions, in accordance with still another embodiment of the present invention.

Reference is made to flow chart diagram 800 of FIG. 8, illustrating a method operations performed in an asymmetric double-sided brush scrubber, in accordance with one embodiment of the present invention. The method begins in operation 802 in which a wafer is provided. Then, in operation 804, a first roller having a brush is provided. The first roller is configured to have a first diameter. Next, in operation 806, a second roller having a brush is provided. The second roller is configured to have a second diameter such that the second diameter is smaller than the first diameter.

Proceeding to operation 808, the wafer is inserted between the first roller and the second roller such that the roller having the larger diameter is closer to the active side of the wafer while the second roller having the smaller diameter is adjacent to the back side of the wafer. Moving to operation 810, equal force is applied to the wafer using the first and the second rollers. In this manner, the larger diameter of the first roller provides a larger surface area coverage than the smaller diameter of the second roller.

Continuing to operation 812, the scrubbing of the wafer using the rollers is continued while fluids are applied through the brush and/or fluid application nozzles. In the following operation 814, the scrubbing of the wafer is discontinued when the cleaning process removes the contaminants on the active and back side of the wafer.

Although the foregoing invention has been described in some detail for purposes of clarity of understanding, it will be apparent that certain changes and modifications may be practiced within the scope of the appended claims. For example, although the following parameters are associated with an exemplary "300 mm wafer," the parameters may be modified for application to substrates of varying sizes and shapes such as those employed in the manufacture of semiconductor devices and flat panel displays, hard drive discs, flat panel displays, and the like. Additionally, the present embodiments are to be considered as illustrative and not restrictive, and the invention is not to be limited to the details given herein, but may be modified within the scope and equivalents of the appended claims.

What is claimed is:

1. An asymmetric double-sided substrate scrubber, comprising:
    a first roller constructed from a first material having a first density; and
    a second roller constructed from a second material having a second density, the second density configured to be greater than the first density,
    wherein the first roller is configured to be applied onto a first side of a substrate with a first force and the second roller is configured to be applied onto a second side of the substrate with a second force that is configured to be substantially equivalent to the first force, and further wherein the higher density of the second material causes the second roller to have a substantially smaller contact surface area with the second side of the substrate and the lower density of the first material causes the first roller to have a greater contact surface area with the first side of the substrate enabling the first roller to apply more mechanical action on the first side of the substrate.

2. An asymmetric double-sided substrate scrubber of claim 1, wherein the higher density of the second material causes the second roller to have a low compressibility and the lower density of the first material causes the first roller to have a higher compressibility.

3. An asymmetric double-sided substrate scrubber of claim 1, wherein the first side of the substrate is a front side of the substrate and the second side of the substrate is a back side of the substrate.

4. An asymmetric double-sided substrate scrubber of claim 1, wherein the first side of the substrate is a back side of the substrate and the second side of the substrate is a front side of the substrate.

5. An asymmetric double-sided substrate scrubber of claim 2, wherein a density of the first material is configured to be between approximately about 0.07 g/cm$^3$ and 0.085 g/cm$^3$.

6. An asymmetric double-sided substrate scrubber of claim 4, wherein a density of the second material is configured to be between approximately about 0.08 g/cm$^3$ and 0.095 g/cm$^3$.

7. An asymmetric double-sided substrate scrubber of claim 1, wherein the first material and the second material are identical.

8. An asymmetric double-sided substrate scrubber of claim 1, wherein the first material and the second material are polyvinyl alcohol (PVA) foam.

9. An asymmetric double-sided substrate scrubber of claim 1, wherein the first material and the second material are different.

10. An asymmetric double-sided substrate scrubber, comprising:
    a first roller having a first diameter; and
    a second roller having a second diameter, the first diameter configured to be greater than the second diameter,
    wherein the first roller is configured to be applied onto a first side of a substrate with a first force and the second roller is configured to be applied onto a second side of the substrate with a second force configured to be substantially equivalent to the first force such that the greater diameter of the first roller is configured to create a greater contact surface area with the first side of the substrate than the second roller with the second side of the substrate enabling the first roller to apply more mechanical action on the first side of the substrate.

11. An asymmetric double-sided substrate scrubber of claim 10, wherein the first diameter is configured to be between approximately about 2" and about 2.5".

12. An asymmetric double-sided substrate scrubber of claim 11, wherein the second diameter is configured to be between approximately about 2.5" and about 4.5".

13. An asymmetric double-sided substrate scrubber, comprising:
    a pair of first drums having a first belt-type brush mounted thereon, the first belt-type brush being constructed from a first material, the first belt-type brush having a first density; and
    a pair of second drums having a second belt-type brush mounted thereon, the second belt-type brush being constructed from a second material, the second belt-type brush having a second density configured to be greater than the first density,
    wherein the first belt-type brush is configured to be applied onto a first side of a substrate with a first force and the second belt-type brush is configured to be applied onto a second side of the substrate with a second force substantially equivalent to the first force.

14. An asymmetric double-sided substrate scrubber of claim 13, wherein the lower density of the first material causes the first brush to have a substantially greater contact surface area with the first side of the substrate and the higher density of the second material causes the second brush to have a smaller contact surface area with the second side of the substrate.

15. An asymmetric double-sided substrate scrubber of claim 13, wherein the lower density of the first material causes the first brush to have a high compressibility and the greater density of the second material causes the second brush to have a lower compressibility.

16. A method for processing a front side and a back side of a wafer asymmetrically, the method comprising:
    configuring a first brush for processing the front side of the wafer to have a first compressibility;
    configuring a second brush for processing the back side of the wafer to have a second compressibility; and
    applying equal forces to the front side and the back side of the wafer using the first brush and the second brush such that the first brush achieves a greater compressibility on the front side of the wafer than the second brush on the back side of the wafer enabling the first brush to apply more mechanical action on the first side of the wafer.

17. A method for processing a front side and a back side of a wafer symmetrically as recited in claim 16, wherein configuring the first brush for processing the front side of the wafer to have the first compressibility includes, constructing the first brush from a first material having a first density.

18. A method for processing a front side and a back side of a wafer asymmetrically as recited in claim 17, wherein configuring the second brush for processing the back side of the wafer to have the second compressibility includes, constructing the second brush from a second material having a second density, wherein the second density is configured to be higher than the first density.

19. A method for cleaning a front side and a back side of a wafer asymmetrically, the method comprising:

providing a first roller having a material with a first compressibility;

providing a second roller having a material with a second compressibility, the first compressibility configured to be greater than the second compressibility;

inserting the wafer such that the first roller having the material with the greater compressibility is closer to the front side of the wafer and the second roller having the material with the lower compressibility is configured to be adjacent to the back side of the wafer;

applying equal force to the front side and the back side of the wafer using the first roller and the second roller such that the greater compressibility of the first roller is configured to provide a larger surface area coverage than the second roller with the back side of the wafer, the larger surface area coverage of the first roller enabling the first roller to apply more mechanical action on the front side of the wafer;

continuing a scrubbing of the wafer using the first roller and the second roller while applying fluids through one of the brush and a fluid application nozzle; and discontinuing the scrubbing when the cleaning process removes contaminants on the front side and the back side of the wafer.

20. A method for cleaning a front side and a back side of a wafer asymmetrically as recited in claim 19, wherein the material of the second roller has a greater density than the material of the first roller.

21. An asymmetric double-sided substrate scrubber, comprising:

a first roller constructed from a first material having a first density; and a second roller constructed from a second material having a second density, the second density configured to be greater than the first density, wherein the first roller is configured to be applied onto a first side of a substrate with a first force and the second roller is configured to be applied onto a second side of the substrate with a second force that is configured to be substantially equivalent to the first force, and further wherein the higher density of the second material causes the second roller to have a low compressibility and the lower density of the first material causes the first roller to have a higher compressibility, and a density of the first material is configured to be between approximately about 0.07 g/cm$^3$ and 0.085 g/cm$^3$.

22. An asymmetric double-sided substrate scrubber, comprising:

a first roller constructed from a first material having a first density; and a second roller constructed from a second material having a second density, the second density configured to be greater than the first density, wherein the first roller is configured to be applied onto a first side of a substrate with a first force and the second roller is configured to be applied onto a second side of the substrate with a second force that is configured to be substantially equivalent to the first force, and further wherein the first side of the substrate is a back side of the substrate and the second side of the substrate is a front side of the substrate and a density of the second material is configured to be between approximately about 0.08 g/cm$^3$ and 0.095 g/cm$^3$.

* * * * *